United States Patent [19]
Marks et al.

[11] Patent Number: 5,409,392
[45] Date of Patent: Apr. 25, 1995

[54] BURN-IN SOCKET

[75] Inventors: Richard L. Marks, Mechanicsburg; Thomas E. Marone, Lewisberry, both of Pa.

[73] Assignee: Wells Electronics, Inc., South Bend, Ind.

[21] Appl. No.: 57,438

[22] Filed: May 14, 1993

[51] Int. Cl.[6] .............................................. H01R 23/72
[52] U.S. Cl. ...................................... 439/266; 439/73
[58] Field of Search ...................................... 439/68-73, 439/266, 269, 330, 331, 525, 526

[56] References Cited
U.S. PATENT DOCUMENTS 5,139,437  8/1992  Ikeya et al. .......................... 439/266
5,228,866  7/1993  Epenshade et al. ................. 439/266

*Primary Examiner*—Neil Abrams
*Attorney, Agent, or Firm*—James D. Hall

[57] ABSTRACT

A socket for carrying an integrated circuit (IC) package. The socket, which is particularly useful for burn-in testing, includes a base 18 which houses a plurality of conductive contacts 46 and a movable top 108 which is shiftably connected to the base. A table 32 is connected to the base 18 and supports the IC package after insertion. The socket also includes a contact actuation plate 72 which is operably connected to the movable top 108 and is shiftable with the top. Latches 96 are shiftably connected to the base 18 and shift with the top 108 between latched and unlatched positions to secure the IC atop the table during testing. The actuator plate 72 may also include retractable location pins 82 to insure proper IC alignment in the socket.

6 Claims, 4 Drawing Sheets

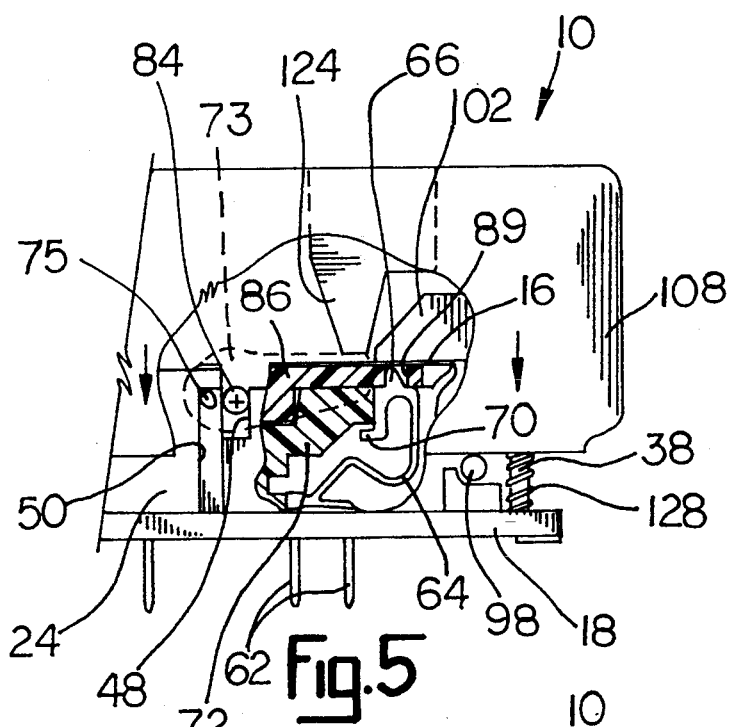
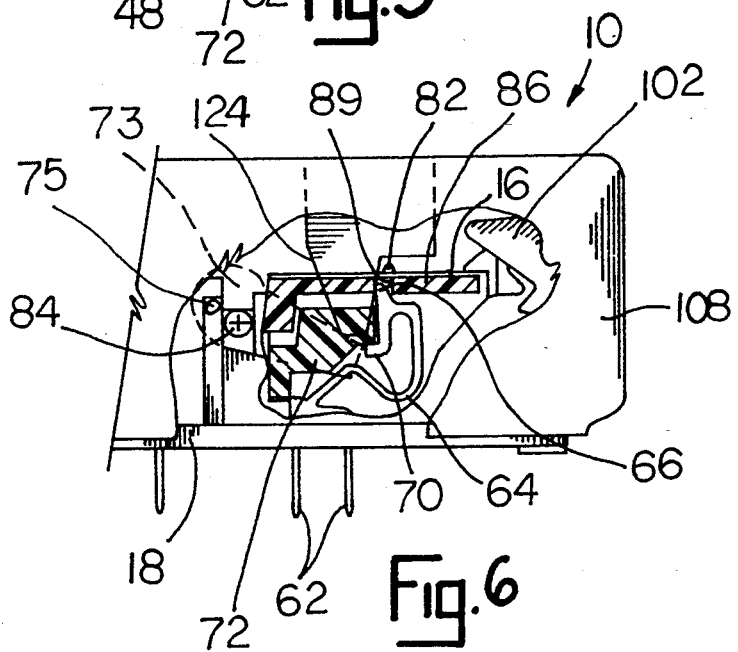
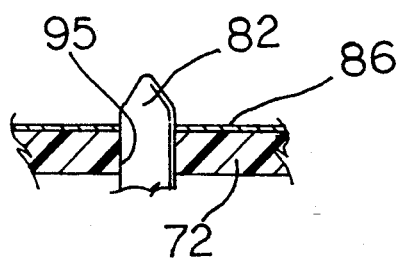
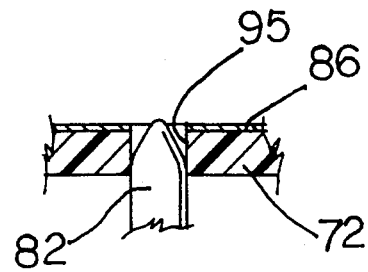

5,409,392

BURN-IN SOCKET

FIELD OF THE INVENTION

This invention relates to sockets which carry integrated circuits (ICs) and will have application to burn-in test sockets.

BACKGROUND OF THE INVENTION

Test sockets for ICs and related devices are useful items which serve to secure the IC during testing and also to provide the electrical connection between the IC and the test load. Most test sockets are custom designed for a particular IC device or for a basic type of IC device.

A typical socket is shown in U.S. Pat. No. 5,228,866, granted July 20, 1993, and incorporated herein by reference. In that socket, a pair of opposed latches are operably connected to the socket's movable top and serve to secure an IC carrier package in the socket. Additionally, that socket included a rod which coacted with the movable top to shift the electrically conductive contacts between engaged and disengaged positions with respect to the IC leads.

U.S. Pat. No. 5,020,998 discloses an IC test socket which includes latches pivotally connected to the socket base which coact with the movable top. In the '998 patent, the electrically conductive contacts are urged between their engaged and disengaged positions by camming faces on the inside surfaces of the top. The upper edge of each preloaded contact rides against the camming faces during top movement and the moment created by top movement is transmitted to the engagement part of the contact to shift the contact between its two positions. The sockets of both the '998 patent and the '048 application rely on the IC carrier to provide the clamping function necessary to maintain constant electrical contact between the IC leads and the socket contacts.

SUMMARY OF THE INVENTION

The test socket of this invention may be employed to secure an IC for testing either with or without an IC carrier package. The socket includes in addition to the base, top, contacts and movable latches, a stripper plate which serves as the table for supporting the IC to be tested. The stripper plate has a plurality of holes aligned with the engagement parts of the contacts.

A contact actuator member, typically a plate is shiftably positioned beneath the stripper plate and includes a ledge which rests on a cantilevered upper beam part of each contact. The contact actuator is operably connected, as by a camming lever, to the movable top and serves to urge the contacts between a normally engaged position in which the upper contact edges extend through their aligned holes in the stripper plate and a retracted position below the upper surface of the stripper plate.

The socket may also include locating pins at opposite corners of the contact actuator which shift with the actuator between extended and retracted positions. The locating pins serve to properly position the IC such that the IC leads are in electrical contact with the engagement part of each conductive contact when the IC is secured.

Opposed latches serve to secure and clamp the IC to the stripper plate with the IC leads in contact with the conductive contacts. The latches coact with the movable top to shift between a latched position, described above, and an unlatched position spaced from the IC wherein the IC may be removed from the socket. The latch construction allows the socket to function as a zero insertion force (ZIF) device.

Accordingly, it is an object of this invention to provide for a novel and improved IC test socket.

Another object is to provide for an IC test socket which can be used with leaded and leadless ICs, with or without an IC carrier package.

Another object is to provide for an IC test socket which is of dependable construction and is efficient and economical.

Another object is to provide for an IC test socket which provide firm and constant electrical contact between the IC and a test load.

Another object is to provide for an IC test socket which can be easily adopted to secure an IC regardless of the number and position of IC leads or contact pads.

Other objects will become apparent upon a reading of the following description.

BRIEF DESCRIPTION OF THE DRAWINGS

A preferred embodiment of the invention has been depicted for illustrative purposes only wherein:

FIG. 5 is a fragmented elevation view of the socket as seen from line 5—5 of FIG. 2 with the top up.

FIG. 6 is a fragmented elevation view of the socket with the top depressed.

FIG. 7 is a fragmented sectional view of the locating pin taken along line 7—7 of FIG. 2 with the top up.

FIG. 8 is a fragmented sectional view similar to FIG. 7 with the top depressed.

DESCRIPTION OF THE PREFERRED EMBODIMENT

Figure 1:
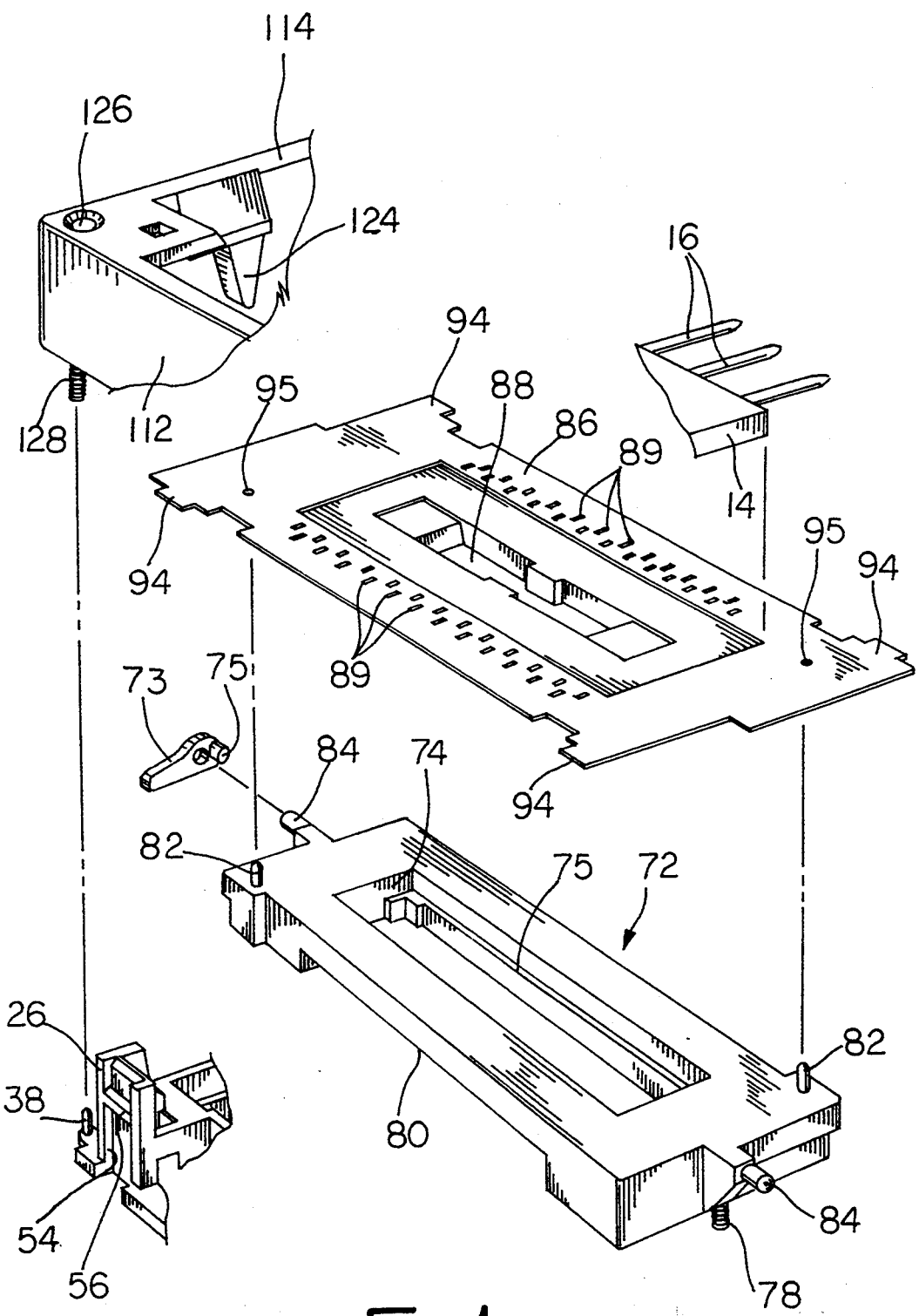
FIG. 1 is a partial exploded view of the test socket showing the contact actuator plate and the stripper plate.
Figure 2:
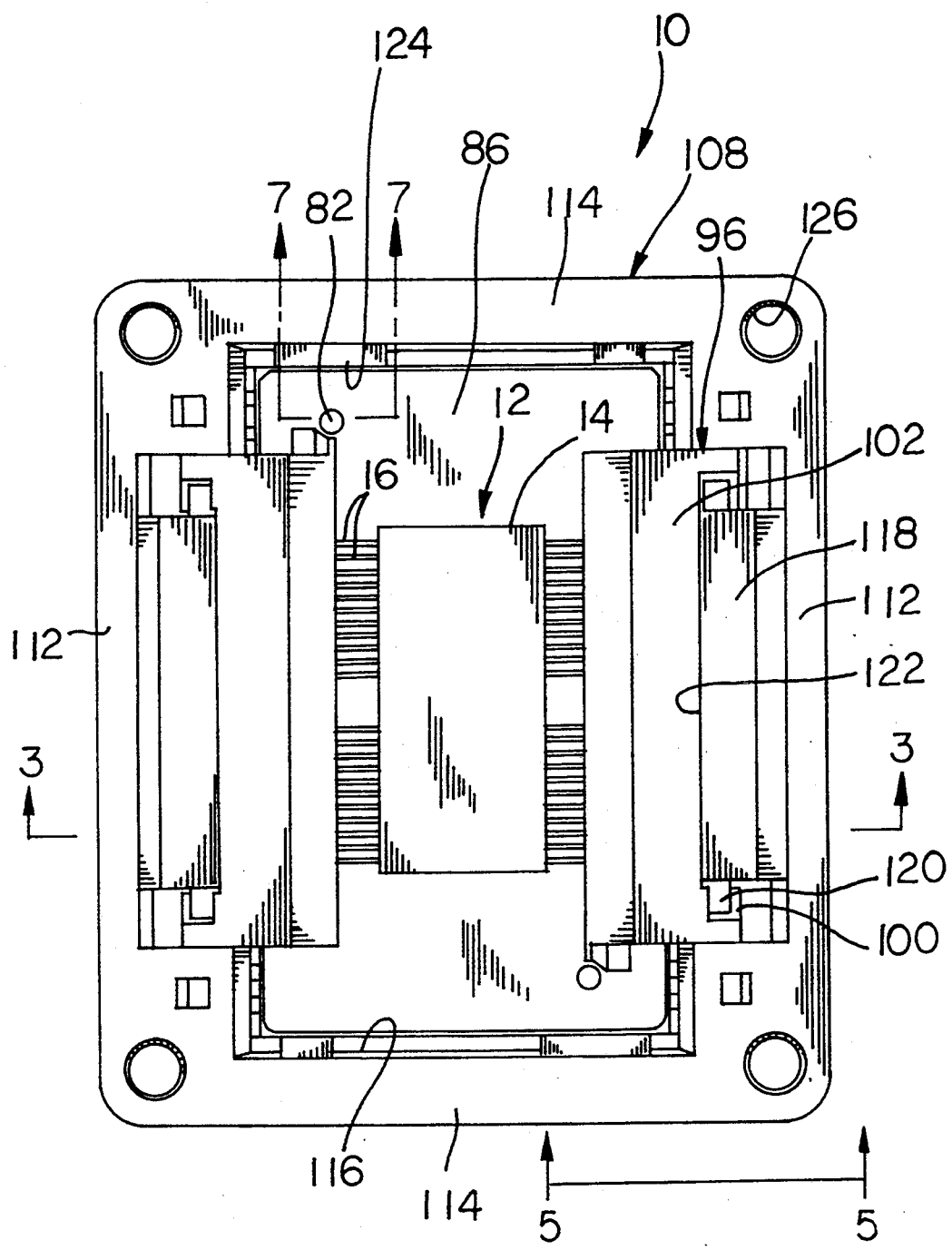
FIG. 2 is a top plan view of the test socket.

The preferred embodiment herein described is not intended to be exhaustive or to limit the invention to the precise form disclosed. It is chosen and described to explain the principles of the invention and its application and practical use to enable others skilled in the art to follow its teachings.

Referring to the drawings, reference numeral 10 generally designates the IC test socket of this invention. Socket 10 is designed to secure an IC 12 during testing and/or burn-in operations. IC 12 typically includes a semiconductor body 14 and electrically conductive leads 16 which extend outwardly from two or more side edges of the IC body. Alternatively, the IC may be of the leadless type which is also well-known in the art.

Socket 10 includes a base 18. Base 18 is defined by bottom wall 20, inset side walls 22, end walls 24 and corner posts 26. A plurality of slits 28 are defined through bottom wall 20 at preselected spaced locations. Pilot pins 30 extend downwardly from bottom wall 20 as shown.

Table 32 extends upwardly from bottom wall 20. Slots (not shown) and hole 36 are defined through table 32 and bottom wall 20 and serve as a heat sink for IC 12.

Locating pins 38 extend upwardly from each corner of bottom wall 20 as shown. Each side wall 22 has opposed spaced grooves (not shown) aligned with grooves (not shown) in bottom wall 20 to accommodate contacts 46 as described below.

Each end wall 24 defines a slot 48 and recess 50. Hook parts 52 extend upwardly from bottom wall 20 at each corner post 26. Each corner post 26 defines outer recess 54 and includes shoulder part 56. Holes (not shown) may be defined through bottom wall 20 to provide an additional heat sink.

Each contact 46 is formed of electrically conductive material of well-known composition, such as beryllium copper alloy. Each contact 46 includes a base part 60 and one or more legs 62. Base 60 is preferably secured in base grooves (not shown) with legs 62 extending through slits 28 in bottom wall 20. A serpentine neck 64 extends upwardly from base part 60 and terminates in a head part 66. Web 68 depends from head part 66 and includes an inner cantilevered beam 70. Contacts 46 are preferably of a one-piece construction as shown.

Figure 3:
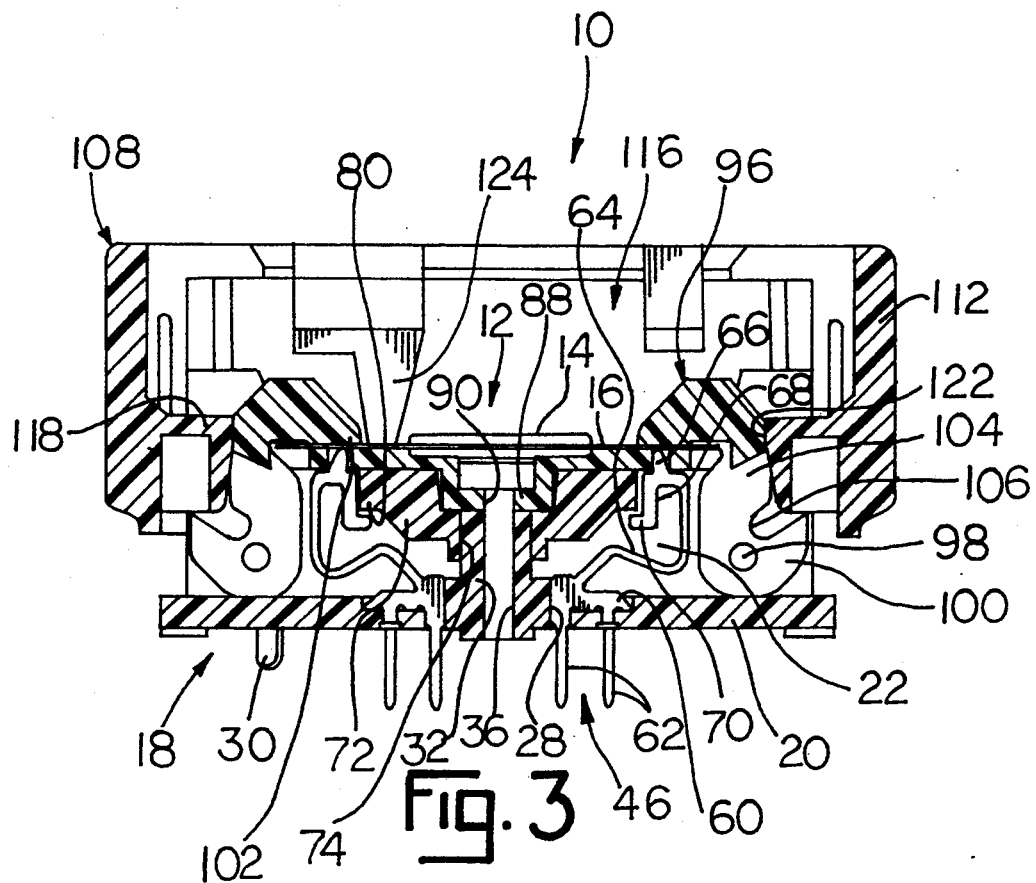
FIG. 3 is a sectional view taken along line 3—3 of FIG. 2 with the top in the up position.
Figure 4:
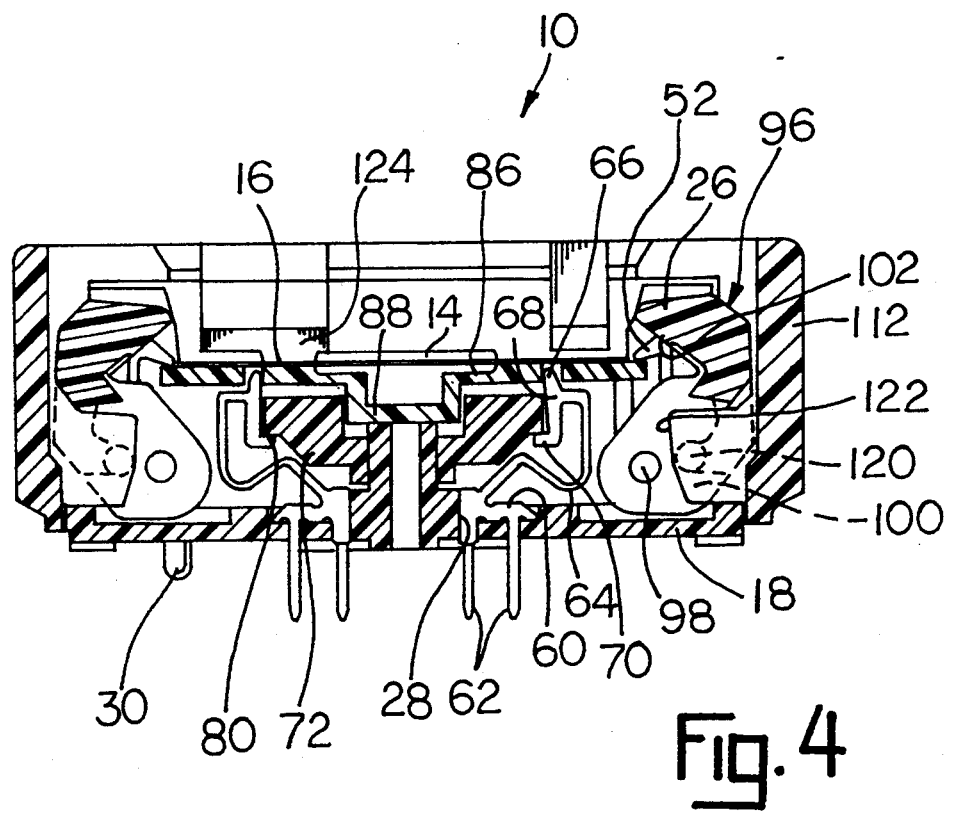
FIG. 4 is a sectional view similar to FIG. 3 with the top depressed.

Actuator plate 72, as shown, is generally rectangular and defines central opening 74 which closely conforms to the dimensions of base table 32. A pair of spaced holes (not shown) are defined in the lower surface of actuator plate 72 and accommodate biasing springs 78 (one shown). Actuator plate 72 defines opposite lower recessed ledges 80 which rest on contact beams 70 as shown in FIGS. 3 and 4. Actuating pins 84 extend from opposite ends of actuator plate 72 and are fitted in base end wall slots 48. A locating pin 82 is secured in and extends upwardly from opposite corners of actuator plate 72. A lever 73 is connected to each actuating pin 84. Each lever 73 has a projection 75 which is fitted in base end wall recess 48.

Stripper plate 86 overlies actuator plate 72 as shown. Stripper plate 86 includes an integral locating basin 88 which is fitted in opening 74 of actuator plate 72 and rests on inner shoulder 75. A hole 90 is aligned with table hole 36.

Stripper plate 86 has a plurality of slits 89 which accommodate the head parts 66 of each contact 46. The number of slits 89 will vary on the number of leads 16 which extend from IC body 14. Stripper plate 86 also has corner located projecting tabs 94. Hook parts 52 engage tabs 94 to secure stripper plate 86 in a fixed position relative to base 18.

As shown in the drawings, contacts 46 are preloaded in a normally up position (FIG. 3) with head parts 66 extending through stripper plate slits 89. Springs 78 bias actuator plate 72 so that ledges 80 rest on or closely adjacent to contact beams 70. Locating pins 84 extend through holes 95 in stripper plate 86.

A pair of opposed latches or pressure pads 96 are pivotally connected to base 18 as by journal pins 98. Each latch 96 is of single piece construction and includes spaced lower actuating shoulders 100 and an upper pressure pad 102 connected to shoulders 100 by neck 104 which is defined by an outwardly recessed camming face 106.

Socket 10 also includes a movable top 108 which is shiftably secured to base 18 as by hook parts (not shown) which engage shoulder parts 56 in corner post recess 54. Top 108 includes spaced side walls 112 and end walls 114 which define central opening 116. IC 12 may be inserted through top central opening 116 for testing operations as described below.

Latch actuators 118 extend inwardly at opposite side walls 112 of top 108. Each latch actuator 118 includes projecting actuator pins 120 which serve to shift latches 96 between their latched and unlatched positions (FIGS. 3 and 4, respectively). Each latch actuator 118 also defines an inner locating face 122 which serves to urge its associated latch 96 into the latched position. Each end wall 114 of top 108 includes a lever actuator 124.

Top 108 defines corner located holes 126 aligned with base locating pins 38. Springs 128 circumscribe pins 38 and serve to bias top 108 in an up position as shown in FIG. 3.

Socket 10 is operated in the following manner. With the component parts connected as described above, top 108 is depressed towards base 18. As top 108 moves towards base 18, each lever actuator 124 depresses into contact with its respective lever 73 to rotate the lever towards base bottom wall 20. As lever 73 rotates, actuator plate 72 is shifted downwardly towards base bottom wall 20, overcoming the biasing influence of springs 78.

As actuator plate 72 shifts downwardly, ledges 80 depress contact beams 70 as shown in FIG. 4. Due to the serpentine construction of contact necks 64 a moment is generated which urges the contact head part 66 downwardly. In the fully depressed position of top 108 (FIG. 4), contact head parts 66 are recessed in stripper plate slits 89 and out of contact with any IC leads 16.

Also as the top 108 is depressed, latch actuator pins 120 depress to contact latches 96 at their shoulders 100 to pivot the latches about pins 98 into the unlatched position of FIG. 4. In this unlatched position shown, an IC 12 can be removed or loaded into socket 10. IC 12 may be positioned by aligning any body holes (not shown) with locating pins 82. This positions IC leads 16 in alignment with contact heads 66.

Top 108 is then released and the biasing forces of springs 78 and 128 urge the actuator plate 72 and the top 108 away from base 18. Movement of the top 108 is halted when the top's hook parts (not shown) engage shoulder parts 56 and when actuator plate 72 contacts stripper plate 86. As the top 108 shifts towards the up position, latch actuator pins 120 ride against camming faces 106 of latches 96 to urge the latches into a latched position, as shown in FIG. 3.

Also, as actuator plate 72 is shifted away from base 18, contacts 46 return to their preloaded up position (FIGS. 3 and 5) with head parts 66 extending through stripper plate slits 92 into contact with IC leads 16. Pressure pads 102 under the influence of latch actuator 118 pushing against latch shoulders 100 firmly clamp IC leads 16 into contact with contact head parts 66. Locating pins 82 seat in any aligned IC holes (not shown) to securely hold IC body 12 in the correct position. To remove IC 12 after testing or burn-in procedures, the above process is duplicated.

Throughout this specification, descriptions of orientation have been used to guide the reader through a typical embodiment of the socket 10 with regard to the orientation of the base bottom wall 18 secured to a PC board (not shown) in a horizontal right side-up orientation. Obviously, if the orientation of the bottom wall were changed to vertical to accommodate a different mount, the other orientations would change as well. Further, none of the above descriptions are to be construed as limiting the invention to the details given, which may be modified within the scope of the following claims.

What is claimed is:

1. A socket for an integrated circuit having a plurality of conductive leads, said socket comprising a base, an upper support table secured to the base, a plurality of electrically conductive opposed resilient contacts housed in said base, a movable top shiftably connected to said base between an up position and a down position, actuator means operably associated with said base and contacts for shifting said contacts upon movement of said top between an extended position protruding through an upper surface of said support table in electrical contact with said conductive leads, and a retracted position below said upper surface of said support tablet opposed latch means shiftably connected to said base, said latch means shiftable between a latched position for contacting and clamping said conductive leads against said contacts, and an unlatched position wherein said integrated circuit may be removed from said socket.

2. The socket of claim 1 and further including a locating pin housed in said actuator means, said locating pin shiftable along with said actuator means.

3. The socket of claim 1 wherein said latch means includes a pressure pad, said top including means for urging said pressure pad into clamping contact with an IC lead when the latch means is in said latched position.

4. The socket of claim 4 wherein said latch means includes a lower actuating cam member, said top including an actuating pin contacting said camming member as the top is shifted into said down position to shift said latch means into said unlatched position.

5. A socket for an integrated circuit having a plurality of conductive leads, said socket comprising a base, and upper support table secured to the base, a plurality of electrically conductive opposed resilient contacts housed in said base, a movable top shiftably connected to said base between an up position and a down position, actuator means operably associated with said base and contacts for shifting said contacts upon movement of said top between an extended position protruding through an upper surface of said support table in electrical contact with said conductive leads, and a retracted position below said upper surface of said support table, said actuator means including a plate having opposed spaced ledges, said contacts including cantilevered beams, said plate ledges aligned with said contact beams and constituting means for engaging said beams as said top is depresses into its said down position.

6. The socket of claim 5 wherein said plate is joined to an outer actuating lever, said top including a projection contacting said actuating lever to shift said plate as the top is depressed into its down position.

* * * * *